(12) United States Patent
Stevenin (10) Patent No.: US 10,345,364 B2
(45) Date of Patent: Jul. 9, 2019

(54) METHOD AND DEVICE FOR MONITORING A HIGH-VOLTAGE ELECTRIC CURRENT TRANSMISSION LINE

(71) Applicant: RTE Reseau de transport d'electricite, Paris la Defense (FR)

(72) Inventor: Pierre Stevenin, Paris (FR)

(73) Assignee: RTE RESEAU DE TRANSPORT D'ELECTRICITE, La Defense (FR)

(*) Notice: Subject to any disclaimer, the term of this patent is extended or adjusted under 35 U.S.C. 154(b) by 1021 days.

(21) Appl. No.: 14/356,268

(22) PCT Filed: Oct. 30, 2012

(86) PCT No.: PCT/FR2012/052506
§ 371 (c)(1),
(2) Date: May 5, 2014

(87) PCT Pub. No.: WO2013/064778
PCT Pub. Date: May 10, 2013

(65) Prior Publication Data
US 2014/0288863 A1 Sep. 25, 2014

(30) Foreign Application Priority Data
Nov. 4, 2011 (EP) .................................. 11306435

(51) Int. Cl.
*G01R 31/08* (2006.01)
*H02J 3/00* (2006.01)
*H02J 13/00* (2006.01)

(52) U.S. Cl.
CPC .............. *G01R 31/088* (2013.01); *H02J 3/00* (2013.01); *H02J 13/0075* (2013.01); *Y02E 60/7853* (2013.01); *Y04S 40/126* (2013.01)

(58) Field of Classification Search
CPC ...... H02J 3/00; H02J 13/0075; G01R 31/088; Y02E 60/7853; Y04S 40/126
See application file for complete search history.

(56) References Cited

U.S. PATENT DOCUMENTS

| 4,558,310 A | * | 12/1985 | McAllise | G01R 15/18 |
|---|---|---|---|---|
| | | | | 324/127 |
| 5,140,257 A | | 8/1992 | Davis | |
| 5,341,088 A | * | 8/1994 | Davis | G01R 15/14 |
| | | | | 324/105 |
| 5,559,430 A | | 9/1996 | Seppa | |

(Continued)

FOREIGN PATENT DOCUMENTS

WO 2010/054072 A1 5/2010

OTHER PUBLICATIONS

Wan et al., Increasing Thermal Rating by Risk Analysis, IEEE Transactions on Power Systems, Aug. 1999, 14(3), pp. 815-828.*

(Continued)

*Primary Examiner* — Alexander Satanovsky
*Assistant Examiner* — Lina M Cordero
(74) *Attorney, Agent, or Firm* — Young & Thompson (57) ABSTRACT

A method for monitoring a high-voltage electric-current transmission line includes: determining (100) the ampacity (A) of the high-voltage line from a distribution temperature, conduction parameters and meteorological parameters; measuring (202) the current strength effectively transmitted by the high-voltage line using at least one sensor; and monitoring (204), by a monitoring device connected to the sensor, an excess of ampacity (A) by the current strength measured. The determining (100) of the ampacity (A) includes: selecting (108, 110, 112, 114, 116) a value of this ampacity (A) by optimizing a probability of exceeding the distribution temperature, with this probability defined based on a joint probability model (P) of operating current strength and temperature that depends on meteorological parameters; and recording (118) the selected ampacity value in a storage unit of the monitoring device.

20 Claims, 4 Drawing Sheets

(56) References Cited

U.S. PATENT DOCUMENTS

| | | | | |
|---|---|---|---|---|
| 5,933,355 | A | * | 8/1999 | Deb .......................... H02J 3/00 702/3 |
| 7,239,496 | B2 | * | 7/2007 | Schweitzer, III ...... H02H 6/005 361/103 |
| 2007/0038396 | A1 | * | 2/2007 | Zima ...................... H02H 7/226 702/65 |
| 2008/0189061 | A1 | | 8/2008 | Scholtz et al. |
| 2009/0216472 | A1 | * | 8/2009 | Zima ........................ H02H 6/00 702/65 |
| 2010/0017153 | A1 | | 1/2010 | Strehl |
| 2010/0114392 | A1 | * | 5/2010 | Lancaster ................ H02J 3/00 700/292 |

OTHER PUBLICATIONS

Nascimento et al., AmpABL—Methodology of Ampacity Calculation for Overhead Line Considering the Effect of Atmospheric Boundary Layer, IEEE PES Transactions on Power Systems, 2005, pp. 1-8.*

IEEE Standard for Calculating the Current-Temperature of Bare Overhead Conductors, IEEE Power Engineering Society, 2007, pp. 1-69.*

Koval and Billinton, Determination of Transmission Line Ampacities by Probability and Numerical Methods, IEEE Transactions on Power Apparatus and Systems, 1970, 89(7), pp. 1485-1492.*

Tobin et al., Remote Current Sensing on Overhead Power Lines, 2000, pp. 1-7.*

W. Black et al.: "Real-Time Ampacity Model for Overhead Lines", IEEE Transactions on Power Apparatus and Systems, vol. PAS-I02, No. 7, Jul. 1, 1983 (Jul. 1, 1983) , pp. 2289-2293, XP055027255, ISSN: 0018-9510, DOI:10.1109/TPAS.1983.318152 the whole document.

International Search Report, dated Sep. 16, 2013, from corresponding PCT application.

* cited by examiner

METHOD AND DEVICE FOR MONITORING A HIGH-VOLTAGE ELECTRIC CURRENT TRANSMISSION LINE

BACKGROUND OF THE INVENTION

Field of the Invention

This invention relates to a method for monitoring a high-voltage electric current transmission line. It also relates to a device for implementing this method and a corresponding computer program.

The invention relates more particularly to a method for monitoring comprising:

the prior determining of an ampacity of the high-voltage line from an operating temperature limit of the high-voltage line, referred to as distribution temperature, conduction parameters of the high-voltage line and meteorological parameters, the measuring of a current strength effectively transmitted by the high-voltage line using at least one sensor arranged on the high-voltage line, and the monitoring, by a monitoring device connected to the sensor, of an exceeding of the ampacity by the current strength measured.

The ampacity of a high-voltage line is the permissible limit value for the current strength carried by this line, expressed in amperes. It is generally postulated that this ampacity is a constant of which the value depends on the distribution temperature, which is itself constant and calculated based on geometric parameters assumed to be constant of the high-voltage line, and of meteorological parameters. The relation between the ampacity and the distribution temperature is then expressed according to an equation that deterministically supplies a current strength value according to a temperature value of the conductor of the high-voltage line, of meteorological parameters and of intrinsic data of the conductor. The meteorological parameters are selected a priori as the most unfavorable possible in the environment of the high-voltage line in order to ensure that the resulting ampacity calculated in this way constitutes an actually pertinent limit value with regards to the risks of exceeding the distribution temperature. Consequently, the ampacity calculated is generally sub-optimal. As the meteorological parameters are selected a priori, the actual risks of exceeding the distribution temperature, although limited, are generally not controlled.

Description of the Related Art

In the international patent application published under number WO 2010/054072, this problem is raised and overcome by the calculation of a dynamic instantaneous ampacity based on instantaneous meteorological parameters coming from sensors and provided on a regular basis. Of course, this instantaneous ampacity provides a much better estimate of the operating current strength limit, but it requires real-time processing means that have a certain complexity and above all the adding of sensors suitable for reading the pertinent meteorological parameters. Therefore it is not economically optimal. Furthermore, it remains based on a simplified relation between the temperature of the conductor and the resulting current strength.

Moreover, a static ampacity defined by default still remains necessary.

BRIEF SUMMARY OF THE INVENTION

The invention provides a method for monitoring a high-voltage electric-current transmission line that makes it possible to overcome at least part of the aforementioned problems and constraints, in particular that makes it posible to carry out a more precise and reliable calculation of such a value of static ampacity, to thereby provide protection to the transmission line being monitored.

A method is therefore proposed for monitoring a high-voltage electric-current transmission line comprising:

the prior determining of an ampacity of the high-voltage line from an operating temperature limit of the high-voltage line, referred to as distribution temperature, conduction parameters of the high-voltage line and meteorological parameters, the measuring of a current strength effectively transmitted by the high-voltage line using at least one sensor arranged on the high-voltage line, and the monitoring, by a monitoring device connected to the sensor, of an exceeding of the ampacity by the current strength measured, characterized in that the determining of the ampacity comprises:

the selecting of a value of this ampacity by optimizing a probability of exceeding the distribution temperature, with this probability defined based on a joint probability model of operating current strength and temperature that depends on meteorological parameters, and the recording of the selected ampacity value in a storage unit of the monitoring device.

As such, by integrating a probabilistic model of exceeding the distribution temperature in the calculation of the ampacity, a value for the latter is obtained that directly takes into account a risk factor. It is simply sufficient that the model be built on the basis of realistic data, for example real and numerous sampling data, in order to provide a reliable result. Moreover, as the data can be geolocalized, the final value obtained for the ampacity of the high-voltage line under consideration can also itself be pertinent geographically.

Optionally, the selecting of an ampacity value comprises:
the initializing of the ampacity to a first value,
the loop of the following steps, executed at least one time:
estimating the probability of exceeding the distribution temperature for the given ampacity value,
comparing this probability with a limit value, and
updating the ampacity value according to this comparison.

Also optionally, the updating of the ampacity value consists in increasing this value if the estimated probability is less than the limit value and in reducing it if the estimated probability is greater than the limit value.

Also optionally, the loop of steps comprises a stoppage criterion, in particular a maximum number of repetitions of the loop of steps or a difference between the estimated probability and the limit value less than a predetermined threshold when this estimated probability is less than the limit value.

Also optionally, the updating of the ampacity value comprises the application of a convergence by dichotomy.

Also optionally, the joint probability model of operating temperature and current strength is defined as the product, integrated over a plurality of current strengths between 0 and the ampacity, of a probability, depending on meteorological parameters, that the operating temperature is higher than the distribution temperature for a given current strength with a probability that this current strength is reached in light of the ampacity.

Also optionally, the probability, depending on the meteorological parameters, that the operating temperature is higher than the distribution temperature for a given current strength is calculated on the basis of a model established by stochastic sampling using samples of random meteorological variables and a predetermined transfer function, connecting the meteorological parameters and conduction parameters of the high-voltage line to an operating temperature of the high-voltage line.

Also optionally, in a transient thermal imbalance regime between the heating and cooling powers of an overhead conductor of the high-voltage line, the probability of exceeding the distribution temperature is more precisely defined on the basis of the joint probability model of operating current strength and temperature corrected at least by the following two multiplicative factors:
  a factor quantifying a probability of a defect appearing in the high-voltage line, and
  a factor quantifying a probability of the duration of maximum overload of the high-voltage line.

A subject matter of the invention is also a computer program downloadable from a communication network and/or recorded on a computer readable medium and/or executable by a processor, characterized in that it comprises instructions for executing the steps of a method for monitoring a high-voltage electric-current transmission line such as defined hereinabove, when said program is executed on a computer.

A subject matter of the invention is also a device for monitoring a high-voltage electric-current transmission line comprising:
  a computer designed for determining an ampacity of the high-voltage line from an operating temperature limit of the high-voltage line, referred to as distribution temperature, conduction parameters of the high-voltage line and meteorological parameters,
  a unit for storing the determined ampacity value,
  a data transmission interface designed to receive measurement data from a current strength effectively transmitted by the high-voltage line coming from at least one sensor arranged on the high-voltage line, and
  a detector of the exceeding of the ampacity by the current strength measured,
characterized in that:
  the storage unit comprises parameters of a joint probability model of operating current strength and temperature that depends on meteorological parameters, and
  the computer is more precisely designed to determine the ampacity of the high-voltage line by selecting a value of this ampacity by optimizing a probability of exceeding the distribution temperature, with this probability defined based on the stored probability model.

BRIEF DESCRIPTION OF THE DRAWINGS

The invention shall be better understood using the following description, provided solely by way of example and made in reference to the annexed drawings wherein.

DETAILED DESCRIPTION OF THE PREFERRED EMBODIMENTS

Figure 1:
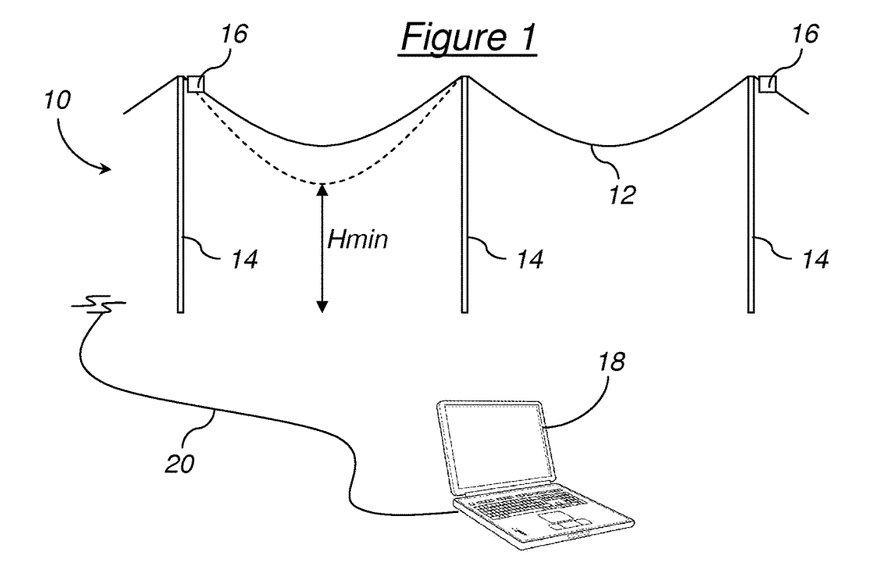
FIG. 1 diagrammatically shows the general structure of an installation comprising a high-voltage line and a device for monitoring according to an embodiment of the invention, FIGS. 2 and 3 diagrammatically show two different embodiments of the device for monitoring of FIG. 1.

The installation shown in FIG. 1 comprises a high-voltage electric current transmission line 10 comprising at least one overhead conductor 12 fixed, at regular intervals, to pylons 14. This installation is intended to operate either in an established regime, during which a thermal balance is observed between the heating and cooling powers of the overhead conductor, or in a transient regime, during which the heating and cooling powers of the overhead conductor are in thermal imbalance. The pylons 14 are intended to maintain the overhead conductor 12 beyond a certain minimum height Hmin in an established regime or H'min in a transient regime.

The installation of FIG. 1 comprises also at least one sensor 16 arranged along the overhead conductor 12 and designed to measure at each instant a current strength effectively transmitted by the high-voltage line 10.

The height Hmin to be complied with between the overhead conductor 12 and the ground (or any installation arranged under the overhead conductor) when it is powered in an established regime in a structure with nominal voltage U is generally calculated as the sum of a minimum distance b, referred to as "basic distance", and of a distance t that depends on U, referred to as "voltage distance". The basic distance b is determined by considerations of encumbrance using the assignment of the ground and of the nature of the installations that it comprises. It is also according to the risk to be taken into account, which stems from the level of voltage and the possible isolation of the conductors. The voltage distance t is according to the nominal voltage U of the structures and of the probability that, in a given lapse of time, a person or an object is located at the basic distance b from the ground or from the installation under consideration. It is suitable as such to adopt for the distance t one of the following three evaluations t1, t2, or t3 according to whether the probability of the presence is considered as low, medium or high:
  $t1=0.0025\ U$,
  $t2=0.005\ U$, and
  $t3=0.0075\ U$,
where t1, t2, t3 are expressed in meters and U in kilovolts. The value of t is obtained by rounding t1, t2 or t3 (according to the case) to the nearest decimeter. Concretely, the voltage distance makes it possible to prevent overvoltage phenomena in the overhead conductor 12.

Consequently, in order for a striking to occur in an established regime (i.e. the forming of an electrical arc from the high-voltage line in consideration), the following three conditions must be fulfilled:
  the height Hmin is not complied with,
  an overvoltage appears in the high-voltage line, and
  A third-party element is located directly under the high-voltage line.

To the height Hmin corresponds a maximum temperature of the overhead conductor 12 or operating temperature limit of the high-voltage line 10, referred to as "distribution temperature". The value Trep of this distribution temperature can be calculated deterministically and is known per se using the height Hmin and local geometric parameters of the high-voltage line such as: height of fastening of the overhead conductor between two pylons and distance between these pylons, height H between the lowest point of the overhead conductor and the ground at a given reference temperature, etc.

Similar reasoning applies to the transient regime, except that the height H'min to be complied with between the overhead conductor 12 and the ground (or any installation arranged under the overhead conductor) is calculated as the sum of the basic distance b and of a voltage distance t' that does not take the overvoltages into account. The voltage distance t' is less than t, in such a way that the height H'min is less than Hmin and the distribution temperature T'rep in a transient regime is greater than Trep. On the other hand, the distribution temperature Trep in an established regime is constantly tolerated, while the distribution temperature T'rep in a transient regime is tolerated only for a predetermined duration of 10, 20 or 30 nm for example.

The installation shown in FIG. 1 further comprises a device for monitoring 18 connected to the sensor 16, designed for:

- prior determining a value of the ampacity of the high-voltage line 10 from the distribution temperature, conduction parameters of the high-voltage line 10 and meteorological parameters such as values for ambient temperature, sunshine and wind speed, storing this ampacity value,
- receiving measurement data of the current strength effectively transmitted by the high-voltage line 10 coming from the sensor 16, and
- detecting the exceeding of the ampacity by the current strength measured, with this exceeding able to be at the origin of the triggering of an alarm or of the stoppage of a transmission of current over the high-voltage line 10.

The ampacity being according to the distribution temperature, its value will also be according to the established or transient regime. In an established regime, it is generally qualified as "temporary backup" current strength and in a transient regime, as "transient" current strength.

Figure 2:
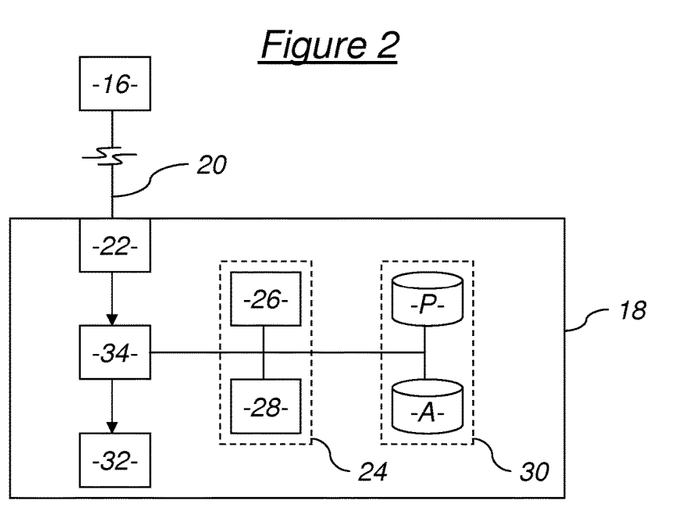
Figure 3:
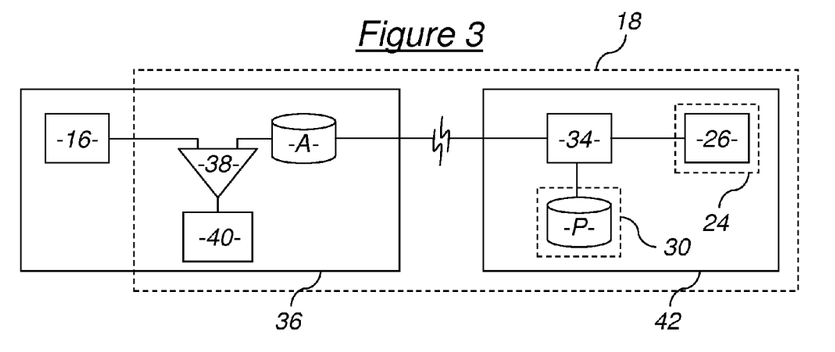

Different embodiments can be imagined for implementing the device for monitoring 18, of which details for two shall be provided in reference to FIGS. 2 and 3. In FIG. 1, this device is shown as able to be materialized by a computer. Conventionally, this computer comprises a microprocessor, a random access memory for executing processing controlled by the microprocessor, a non-volatile memory for storing parameters and computer programs, a bus for exchanging data between the microprocessor, the random access memory and the non-volatile memory, at least one communications port for exchanging data with external devices such as the sensor 16, etc. More precisely, the non-volatile memory can store a computer program designed for prior determining the ampacity and a computer program designed for detecting the exceeding of the ampacity by the current strength measured and the possible triggering of an alarm.

A wired connection 20 is shown to connect the device for monitoring 18 to the sensor 16 but this connection can also be at least partially via radio.

In the first embodiment shown in FIG. 2, for example in accordance with what is shown in FIG. 1, the device for monitoring 18 is a programmable electronic device, for example a computer or a programmable integrated circuit, in communication with the sensor 16 via the wired or radio connection 20, comprising:

- a port 22 for exchanging data with the sensor 16, operating according to a communications protocol that is compatible with the connection 20, for receiving measurement data of a current strength effectively transmitted by the high-voltage line 10,
- first storage unit 24, for example a portion of a non-volatile memory, comprising a first computer program 26 designed for prior determining the ampacity of the high-voltage line 10 and a second program 28 designed for detecting the exceeding of the ampacity by the current strength measured,
- second storage unit 30, for example a portion of a non-volatile memory, comprising parameters P (or P' in a transient regime) of a joint probability model of operating current strength and temperature of the high-voltage line 10 depending on meteorological parameters and a value of the ampacity A (or A' in a transient regime) intended to be calculated using the first computer program 26,
- possibly, an audible and/or visual alarm 32, and
- a processor 34, connected to the port 22 for receiving the current strength values effectively transmitted, to the alarm 32 in order to trigger under certain conditions defined by example in the second program 28, to the first storage unit 24 for the executing of programs 26 and 28 and to the second storage unit 30 for using the parameters P (or P' in a transient regime) and for recording the ampacity A (or A' in a transient regime).

The first computer program 26 is more precisely designed to determine the ampacity A (or A' in a transient regime) by selecting a value of this ampacity by optimizing a probability of exceeding the distribution temperature Trep (or T'rep in a transient regime), with this probability defined based on parameters P (or P' in a transient regime) of the probability model stored in memory 30.

Note that alternatively, the device for monitoring 18 can be implemented in the form of a non-programmable integrated circuit. In this case, at the cost of less flexibility, the calculations can be accelerated.

In another embodiment shown in FIG. 3, a portion of the processing of the device for monitoring 18 can be brought closer to the sensor 16 and therefore implemented in a box 36 comprising it, with this box then being arranged along the overhead conductor 12. This portion of the processing concerned is that specifically covering the monitoring of the high-voltage line 10 when its ampacity A (or A' in a transient regime) is known. It corresponds to the functions carried out using the computer program 28 of the previous embodiment.

The box 36 comprises as such, further to the sensor 16, a memory for storing the ampacity A (or A' in a transient regime) of the high-voltage line 10, a comparator 38 for detecting the exceeding of the ampacity A (or A' in a transient regime) by the current strength measured by the sensor 16, and a member 40 for triggering an action, for example when the current strength measured exceeds the ampacity value A (or A' in a transient regime) for more than a predetermined threshold duration. This member 40 is for example an audible and/or visual alarm as in the previous embodiment or, more advantageously in this embodiment, a device for cutting off the current transiting in the overhead conductor 12.

The other portion of the processing carried out by the device for monitoring, i.e. the portion of the processing concerning the determining of the ampacity A (or A' in a transient regime), is implemented in another device 42, for example a computer or any electronic device. This other device 42 is consequently simplified in relation to the electronic device implementing the device for monitoring of the previous embodiment: it comprises for example only the processor 34, a non-volatile memory 24 for storing the first computer program 26 and a non-volatile memory 30 for storing parameters P (or P' in a transient regime). It communicates with the box 36 for the transmission of a value of the ampacity A (or A' in a transient regime) when it has carried out its processing.

Other embodiments can also be considered. For example, the device for monitoring 18 could be entirely integrated into the box 36.

Figure 4:
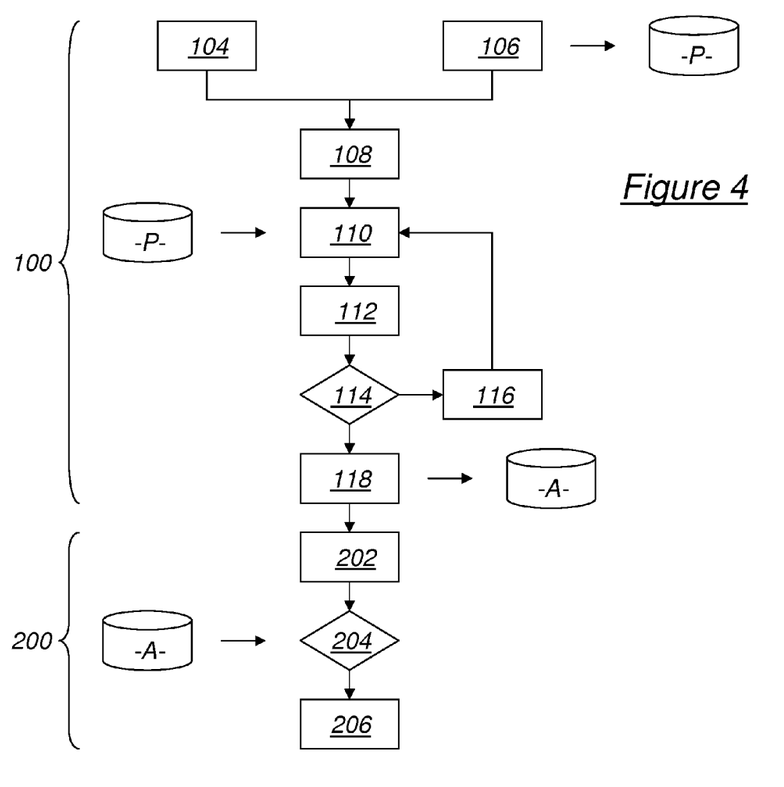
FIG. 4 shows the successive steps of a method for monitoring implemented in the device for monitoring of FIG. 2 or 3, according to an embodiment of the invention

Details of a possible operation of the device for monitoring 18 shall now be provided in reference to FIG. 4 for the implementation of a method for monitoring the high-voltage line 10.

During a prior phase 100, this method consists in determining, for the established regime, an ampacity value A of the high-voltage line 10 such that the probability of exceeding the distribution temperature Trep while the current strength I transmitted remains less than A is the closest possible, without exceeding it, to a threshold value Ps considered as optimal. Optionally and in a complementary manner, the method can further consist in determining, for the transient regime, an ampacity value A' of the high-voltage line 10 such that the probability of exceeding the distribution temperature T'rep while the current strength I transmitted remains less than A' is as close as possible, without exceeding it, to a threshold value P's considered as optimal.

The threshold value Ps for the established regime is for example a predetermined value fixed a priori. The same applies for the threshold value P's for the transient regime.

In the established regime, the probability of exceeding the distribution temperature Trep while the operating current strength I remains less than the ampacity A depends on the significant meteorological parameters $\theta$ of an environment (location, season, etc.) wherein the high-voltage line 10 is located. It can advantageously be written in the following form:

$$p_\theta(T > Trep, I < A) = \int_0^A p_\theta(T > Trep, I)\,dI. \quad (1)$$

It is as such defined on the basis of a joint probability model $p_\theta(T>Trep,I)$ of operating current strength and temperature, wherein this joint probability depends on the meteorological parameters $\theta$ and is integrated over a plurality of current strengths between 0 and the ampacity A. More precisely, and in accordance with the Bayesian analysis rules, this joint probability $p_\theta(T>Trep,I)$ is the product of a posterior probability of temperature for a given operating current strength that depends on meteorological parameters, noted as $p_\theta(T>Trep|I)$, and of a prior probability of operating current strength that depends on meteorological parameters, noted as $p_\theta(I)$, i.e.:

$$p_\theta(T>Trep,I)=p_\theta(T>Trep|I)p_\theta(I).$$

In practice, the prior probability $p_\theta(I)=p(I)$ is independent of the meteorological parameters $\theta$ and of the ampacity A. It obeys a law of which the parameters can be estimated based on a statistical sampling of operating current strengths of high-voltage lines over an entire territory, over an entire year and with all voltage levels taken as a whole. It can then be represented by a distribution function that represents the load monotone of the high-voltage line 10, such as that shown in FIG. 5, between 0%.A and 100%.A.

Figure 5:
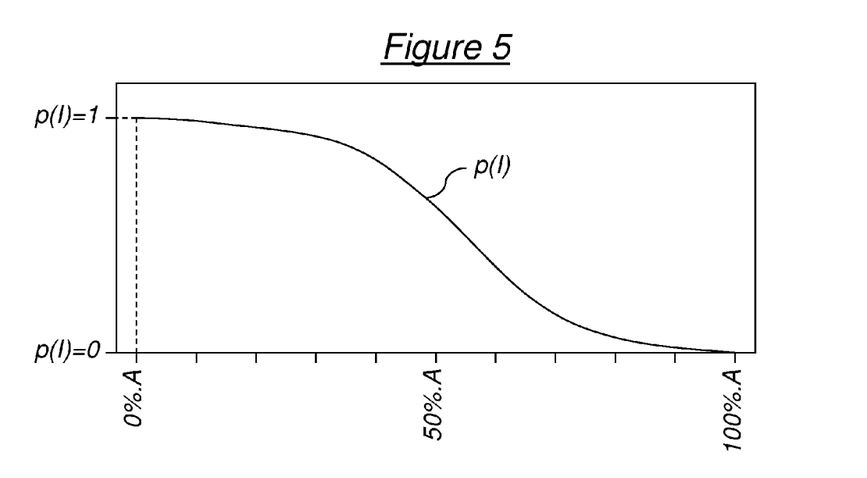
FIGS. 5 and 6 are diagrams showing models of probabilities laws of which the parameters are stored by the device for monitoring of FIG. 2 or 3.

It is either the statistical parameters (mean, variance, etc.) of a law that this prior probability obeys, or directly the sampled values that it takes, which are recorded as parameters P in the storage unit 30. These parameters can be predetermined. They can also be calculated by the device for monitoring 18 on the execution of the first program 26 during a step 104 using a set of samples that represent the operating current strengths of high-voltage lines over an entire territory, over an entire year and with all voltage levels taken as a whole.

In practice also, the posterior probability $p_\theta(T>Trep|I)$ depends on meteorological parameters $\theta$ and on the operating current strength I. It obeys a law of which the parameters can be estimated based on a stochastic sampling, for example according to a Markov Chain Monte Carlo convergence method (MCMC sampling method) with Gibbs digital sampling, carried out using a transfer function linking the meteorological parameters $\theta$ and conduction parameters of the high-voltage line 10, on the one hand, to a temperature of the high-voltage line, on the other hand, for a given operating current strength value. This sampling is carried out using samples of meteorological parameters that represent the environment wherein the high-voltage line 10 is located. Each sample is for example a triplet of parameters of ambient temperature, sunshine and wind speed. These samples can in particular vary not only as a function of the location (zoning can be carried out) but also as a function of the season. Concretely, on a territory such as France, meteorological studies have been conducted on the three-hourly data of 125 stations over a period of 20 years (1988-2007), based on dividing the territory into several homogeneous geographical zones with regards to distributions of temperature of the conductor (16 zones) and based on a definition of homogeneous seasons also.

The transfer function used is for example a normalized function such as the Cigré equation, defined in the document entitled "Thermal behavior of overhead conductors", published by "B2-overhead lines" study committee of the Cigré organization, WG 22.12, in August 2002, or the IEEE equation, defined in the document entitled "IEEE standard for calculating the current-temperature of bare overhead conductors", published by IEEE Power Engineering Society under the reference IEEE Std 738™-2006, in January 2007. Among the parameters of this transfer function, only the meteorological parameters and the resulting conductor temperature are considered as random variables for stochastic sampling. The conduction parameters of the high-voltage line 10 are considered as constants. Moreover, the geometric parameters that may intervene in the transfer function are fixed for example using a statistical analysis of geometric parameters covering an entire network.

Figure 6:
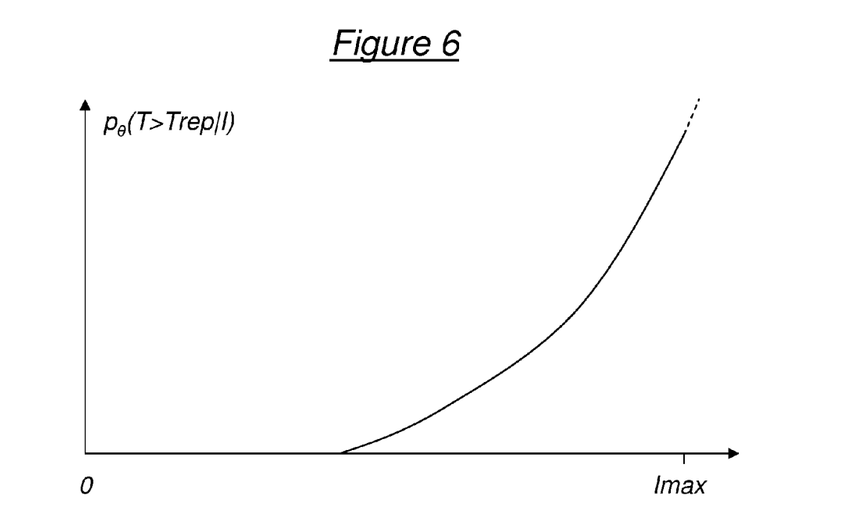

The posterior probability $p_\theta(T>Trep|I)$ can then be represented by a distribution function such as that shown in FIG. 6, for I varying between 0 and Imax amperes, with Imax chosen to be an operating current strength value that is highly unfavorable in light of the meteorological parameters $\theta$, in any case greater than the final value A of ampacity sought.

It is for example directly sampled values that it takes for I varying between 0 and Imax amperes which are recorded as parameters P in the storage unit 30. These parameters can be predetermined. They can also be calculated by the device for monitoring 18 on the execution of the first program 26 during a step 106 using a set of samples that represent meteorological parameters $\theta$ in the environment of the high-voltage line 10. Details will not be provided on this execution, but it conventionally implements the aforementioned stochastic sampling.

When the values of Ps and of parameters P are known, either in a predetermined manner, or by the execution of steps 104 and 106, control passes to a step 108 of initialization, carried out by the device for monitoring 18 on the execution of the first program 26, during which the ampacity is initialized to a first value $A_0$ and an index i is initialized to 0. The first value $A_0$ is for example equal to the value Imax, i.e. the highest operating current strength value for which a value of the probability of exceeding the distribution temperature in light of the meteorological parameters is available.

Then, a loop of steps 110, 112, 114 is executed at least once on at least one value of the index i by the device for monitoring 18 on the execution of the first program 26.

Figure 7:
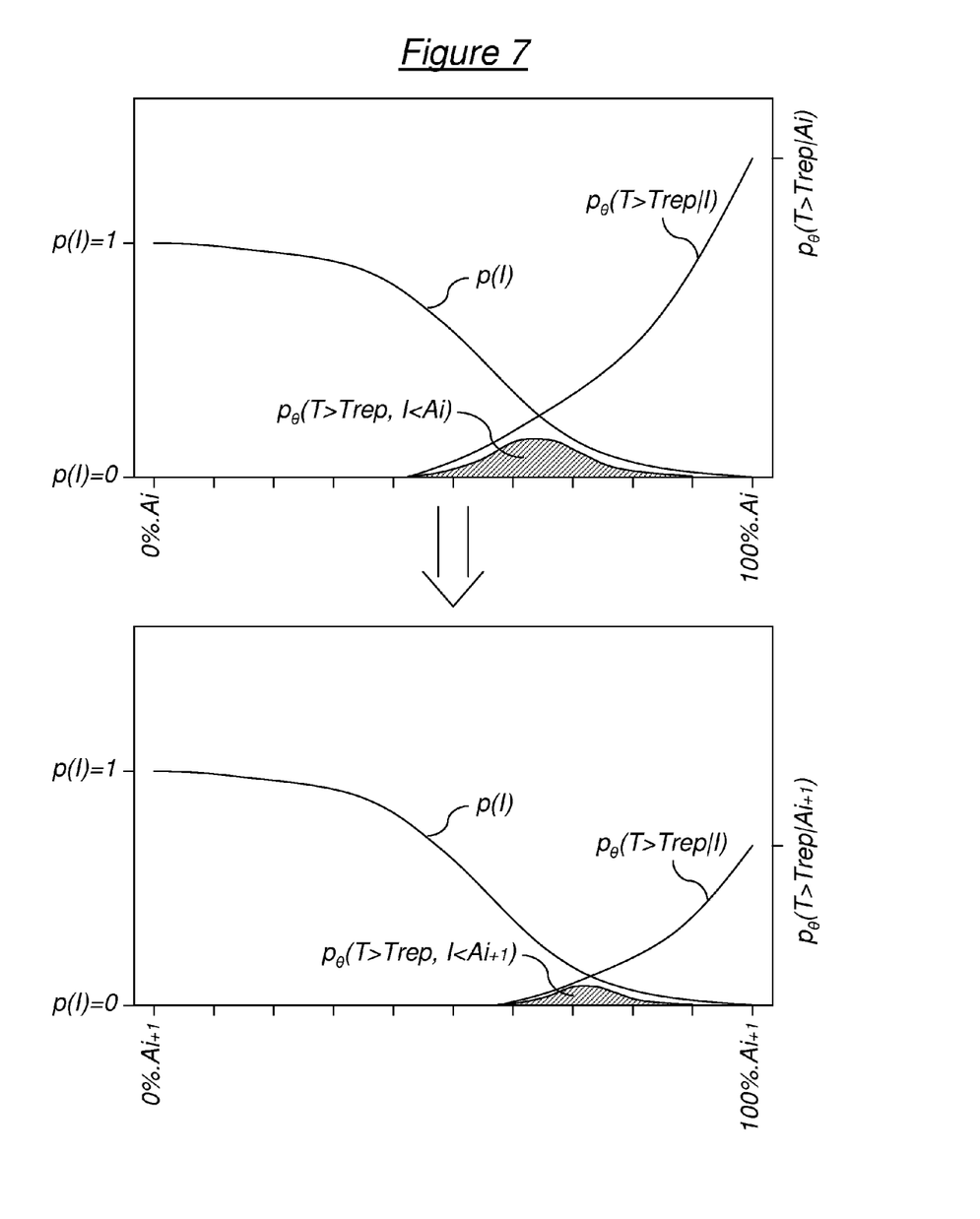
FIG. 7 shows a calculation step of the method of FIG. 4 using the models of FIGS. 5 and 6.

During the step 110, the probability of exceeding the distribution temperature Trep for the ampacity value Ai is calculated. This calculation is carried out as shown in FIG. 7 (diagram at the top). It can be seen in this figure that a portion of the posterior probability curve $p_\theta(T>Trep|I)$ of FIG. 6 is taken again, between 0 and Ai amperes, so as to fit with the prior probability curve p(I). These two curves are then multiplied together point by point between 0 and Ai to provide a curve of which the surface above the axis of the abscissas (greyed in FIG. 7) provides an estimate of the value of the probability $p_\theta(T>Trep,I<Ai)$ since $$p_\theta(T > Trep, I < Ai) = \int_0^{Ai} p_\theta(T > Trep | I) p(I) dI.$$

During the following step 112, the probability $p_\theta(T>Trep, I<Ai)$ is compared with the threshold value Ps.

This step 112 is followed by a test step 114 linked to a stoppage criterion: for example a maximum number imax of repetitions of the loop of steps 110, 112, 114 compared to the index i. As such, according to this stoppage criterion, as long as i<imax, control passes to a step 116 of updating, otherwise control passes to a step 118 of recording. Alternatively, the stoppage criterion can be the fact that the difference between $p_\theta(T>Trep,I<Ai)$ and Ps becomes less than a predetermined threshold $\Delta p$ when $p_\theta(T>Trep,I<Ai)$ is less than Ps. As such, according to this stoppage criterion, as long as $p_\theta(T>Trep,I<Ai)$ is greater than Ps or $p_\theta(T>Trep,I<Ai)$ is less than Ps but $[Ps-p_\theta(T>Trep,I<Ai)]>\Delta p$, control passes to the step 116 of updating, otherwise control passes to the step 118 of recording.

During the step 116, the index i is incremented by one unit and the value of Ai is updated. Given that it is sought to estimate an ampacity value A such as the probability $p_\theta(T>Trep,I<A)$ is as close as possible to the threshold value Ps without exceeding it, updating the ampacity value Ai consists in particular in increasing this value if the estimated probability $p_\theta(T>Trep,I<Ai)$ is less than Ps and in reducing it if it is greater than Ps. More precisely, updating the ampacity value Ai can include the application of a convergence by dichotomy.

Following the execution of the step 116, the method resumes at the step 110 for another loop of steps 110, 112, 114. In particular the calculation of the step 110 resumes with a new value of Ai. The bottom of FIG. 7 shows this new calculation in the case of an updating of Ai by reducing its value. In order to clarify the fact that FIG. 7 shows two successive executions of the step 110, the indexes are noted respectively i and i+1 in the diagram at the top and the one at the bottom of FIG. 7.

The step of recording 118 executed at the end of the loop consists:
either in recording the last value of Ai as selected ampacity A in the storage unit 30 of the device for monitoring 18, in the case of the embodiment of FIG. 2,
or in transmitting the last value of Ai as selected ampacity A to the box 36 and in recording it in the latter, in the case of the embodiment of FIG. 3.

The processing described hereinabove for the established regime and based on the equation (1) is adapted to the transient regime. Indeed, in a transient regime, the probability of exceeding the distribution temperature T'rep while the operating current strength I remains less than the ampacity A' can advantageously be written in the following form:

$$p'_\theta(T > T'rep, I < A') = P1 \times P2 \times p_\theta(T > T'rep, I < A') \qquad (2)$$

$$= P1 \times P2 \times \int_0^{A'} p_\theta(T > T'rep, I) dI,$$

where P1 is the probability of the appearance of a defect and P2 the probability of a maximum overload duration.

P1 and P2 are predetermined values of worst probabilities estimated through feedback. The rest of the calculation and of the processing reverts to the previous case of the established regime, except for the threshold value Ps which is replaced with P's and for the expression of the transfer function that takes a transient form. For example, if it entails the Cigré equation, it is its transient expression that must be retained, wherein this expression requires to know an initial state. This initial state is given by the current strength value before appearance of the defect having caused the transient regime, expressed as a percentage of the maximum current strength for which $p_\theta(T>T'rep|I)$ remains zero. The step of recording 118 then concerns the value A' found.

Following this step of recording 118 that ends the phase 100 of determining the ampacity A (or A' in a transient regime), the method shown in FIG. 4 consists in monitoring the current strength transiting in the high-voltage line 10 during a phase of monitoring 200 properly speaking. The phase of monitoring 200 is carried out by the device for monitoring 18 on the execution of the second program 28.

A first step 202 of this phase of monitoring consists in measuring, using the sensor 16, a current strength effectively transmitted by the high-voltage line. This measurement can be carried out periodically.

Then, during a test step 204, this measured current strength is compared to the ampacity A recorded (or A' in a transient regime). By way of a non-limited example, if this measured current strength exceeds the ampacity A (or A' in a transient regime) for a duration exceeding a predetermined threshold, the test step 204 can be followed by a final step 206 of triggering a visual or auditory alarm or cutting off of current on the high-voltage line 10.

It clearly appears that a device for monitoring such as that described hereinabove according to different possible embodiments makes it possible to take into account a risk factor in estimating the ampacity of the high-voltage line under consideration by integrating therein a probabilistic model. Moreover, as the probabilistic approach is finer and closer to statistical reality than a deterministic approach, the estimated ampacity has a substantial chance of being higher, which makes it possible to increase the transit capacity with the same electricity transport network.

Note moreover that the invention is not limited to the previously described embodiments. It will appear to those skilled in the art that various modifications can be made to the embodiments described hereinabove, in light of the information which has just been disclosed. In the following claims, the terms used must not be interpreted as limiting the claims to the embodiment exposed in this description, but must be interpreted to include therein all of the equivalents that the claims aim to cover due to their training and of which foreseeing this is within the scope of those skilled in the art by applying their general knowledge to the implementation of the information which has just been disclosed.

The invention claimed is:

1. A method, carried out by a monitoring device and at least one sensor in communication therewith, for monitoring a high-voltage electric-current transmission line, comprising:

prior determining, at the monitoring device, of an ampacity of the high-voltage line from a distribution temperature that indicates an operating temperature limit of the high-voltage line, conduction parameters of the high-voltage line, and meteorological parameters, the prior determining of the ampacity comprising at least selecting a value of the ampacity by optimizing a probability of exceeding the distribution temperature, where the probability is defined based on a joint probability model of i) operating current strength (I) of the high-voltage line exceeding the distribution temperature, and where the joint probability model depends on meteorological parameters ($\theta$), said optimizing including steps of iteratively approaching a predetermined limit value of said probability by iteratively varying the ampacity and recording the selected ampacity value in a storage unit of the monitoring device, where the joint probability model is $P_\theta(T>Trep,I)$, $P_\theta$ is the joint probability depending on the meteorological parameters $\theta$, T is the operating temperature of the high-voltage line, Trep is the distribution temperature, and I is the operating current strength of the high-voltage line;

measuring, by use of at least one sensor (16) arranged on the high-voltage line and in communication with the monitoring device, a current strength effectively transmitted by the high-voltage line;

monitoring, by the monitoring device by way of communication with the sensor, the current strength measure by the sensor, and determining whether the measure current strength exceed the selected ampacity stored in the storage unit of the monitoring device; and in the event that the measured current strength is determined to exceed the selected ampacity for a predetermined duration, cutting off current on the high-voltage line.

2. The method for monitoring a high voltage electric-current transmission line as claimed in claim 1, wherein the steps of iteratively approaching in the selecting of an ampacity value comprise:

initializing the ampacity to a first value, and performing the following loop steps at least one time:

a1) estimating the probability of exceeding the distribution temperature for the given ampacity value, a2) comparing the estimated probability with the limit value, and a3) updating the ampacity value according to the comparison of step a2).

3. The method for monitoring a high-voltage electric-current transmission line as claimed in claim 2, wherein the updating of the ampacity value comprises increasing the ampacity value upon a determination that the estimated probability is greater than the limit value.

4. The method for monitoring a high-voltage electric-current transmission line as claimed in claim 3, wherein the loop steps a1, a2 and a3 further comprise a stoppage criterion of i) a maximum number of repetitions of the loop steps a1, a2 and a3 or ii) a difference between the estimated probability and the limit value being less than a predetermined threshold when the estimated probability is less than the limit value.

5. The method for monitoring a high-voltage electric-current transmission line as claimed in claim 4, wherein the updating of the ampacity value comprises an application of convergence by dichotomy.

6. The method for monitoring a high-voltage electric-current transmission line as claimed in claim 3, wherein the updating of the ampacity value comprises an application of a convergence by dichotomy.

7. The method for monitoring a high-voltage electric-current transmission line as claimed in claim 2, wherein the updating of the ampacity value comprises an application of convergence by dichotomy.

8. The method for monitoring a high-voltage electric-current transmission line as claimed in claim 2, wherein the joint probability model of the operating temperature and the operating current strength exceeding the distribution temperature is defined as the product, integrated over a plurality of current strengths between zero and the ampacity, of a probability, depending on the meteorological parameters, that the operating temperature is higher than the distribution temperature for a given current strength with a probability that the current strength is reached in light of the ampacity.

9. The Method for monitoring a high-voltage electric-current transmission line as claimed in claim 2, wherein, in a transient thermal imbalance regime between heating and cooling powers of an overhead conductor of the high-voltage line, the probability of exceeding the distribution temperature is more precisely defined on the basis of the joint probability model of the operating current strength and the operating temperature exceeding the distribution temperature corrected at least by the following two multiplicative factors:

a factor quantifying a probability of a defect appearing in the high-voltage line, and a factor quantifying a probability of the duration of maximum overload of the high-voltage line.

10. The method for monitoring a high-voltage electric-current transmission line as claimed in claim 1, wherein the joint probability model of the operating temperature and the operating current strength exceeding the distribution temperature is defined as the product, integrated over a plurality of current strengths between zero and the distribution temperature for a given current strength with a probability that the current strength is reached in light of the ampacity.

11. The method for monitoring a high-voltage electric-current transmission line as claimed in claim 10, wherein the probability, depending on the meteorological parameters, that the operating temperature is higher than the distribution temperature for a given operating current strength is calculated on the basis of a model established by stochastic sampling using samples of random meteorological variables and a predetermined transfer function, connecting the meteorological parameters and conduction parameters of the high-voltage line to the operating temperature of the high-voltage line.

12. The method for monitoring a high-voltage electric-current transmission line as claimed in claim 1, wherein, in a transient thermal imbalance regime between heating and cooling powers of an overhead conductor of the high-voltage line, the probability of exceeding the distribution temperature is more precisely defined on the basis of the joint probability model of the operating current strength and the operating temperature exceeding the distribution temperature corrected at least by the following two multiplicative factors:
   a factor quantifying a probability of a defect appearing in the high-voltage line, and
   a factor quantifying a probability of the duration of maximum overload of the high-voltage line.

13. A non-transitory computer program recorded on a computer readable medium, that when executed by a processor of a computer, causes the computer to execute the steps of claim 1.

14. A device for monitoring a high-voltage electric-current transmission line, comprising:
   a computer, incorporating a processor and a memory, the memory having recorded thereon program code that, upon execution by the processor, causes the computer to determine a value of an ampacity of the high-voltage line from a distribution temperature indicative of an operating temperature limit of the high-voltage line, conduction parameters of the high-voltage line and meteorological parameters;
   a storage unit that stores the determined ampacity value;
   a data transmission interface that receives, from at least one sensor (16) arranged on the high-voltage line, measurement data of a current strength effectively transmitted by the high-voltage line generated by said least one sensor (16); and
   a detector that determines an exceeding of the ampacity (A) by the current strength based on the received measurement data from the at least one sensor,
   the storage unit also storing parameters of a joint probability model of i) operating current strength of the high-voltage line and ii) operating temperature of the high-voltage line exceeding the distribution temperature, where the joint probability model depends on meteorological parameters, wherein the joint probability model is $P_\theta(T>Trep,I)$, where
      $P_\theta$ is the joint probability depending on the meteorological parameters $\theta$,
      T is the operating temperature of the high-voltage line,
      Trep is the distribution temperature, and
      I is the operating current strength of the high-voltage line,
   wherein the program code further causes the computer to:
      determine the ampacity of the high-voltage line by selecting a value of the ampacity by optimizing a probability of exceeding the distribution temperature, with the probability defined based on the stored probability model $P_\theta(T>Trep,I)$, said optimizing including steps of iteratively approaching a predetermined limit value of said probability by iteratively varying the ampacity and recording of the selected ampacity value in a storage unit of monitoring device, and
      in the event that the measured current strength is determined to exceed the selected ampacity for a predetermined duration, causing current on the high-voltage line to be cut off.

15. A method, carried out by a monitoring device and at least one sensor in communication therewith, for monitoring a high-voltage electric-current transmission line, comprising:
   prior determining, at the monitoring device, of an ampacity of the high-voltage line from a distribution temperature that indicates an operating temperature limit of the high-voltage line, conduction parameters of the high-voltage line, and meteorological parameters, the prior determining of the ampacity comprising at least selecting a value of the ampacity by optimizing a probability of exceeding the distribution temperature,
      where the probability is defined based on a joint probability model of i) operating current strength (I) of the high-voltage line and ii) operating temperature (T) of the high-voltage line exceeding the distribution temperature, and
      where the joint probability model depends on meteorological parameters ($\theta$),
      said optimizing including steps of iteratively approaching a predetermined limit value of said probability by iteratively varying the ampacity and recording the selected ampacity value in a storage unit of the monitoring device,
      where the joint probability model is $P_\theta(T>Trep,I)$,
      $P_\theta$ is the joint probability depending on the meteorological parameters $\theta$,
      T is the operating temperature of the high-voltage line,
      Trep is the distribution temperature, and
      I is the operating current strength of the high-voltage line;
   measuring, by use of at least one sensor (16) arranged on the high-voltage line and in communication with the monitoring device, a current strength effectively transmitted by the high-voltage line;
   monitoring, by the monitoring device by way of communication with the sensor, the current strength measured by the sensor, and determining whether the measure current strength exceeds the selected ampacity stored in the storage unit of the monitoring device; and
   in the event that the measured current strength is determined to exceed the selected ampacity for a predetermined duration, actuating either of a visual or an audible alarm.

16. The method for monitoring a high-voltage electric-current transmission line as claimed in claim 15,
   wherein the steps of iteratively approaching in the selecting of an ampacity value comprise:
   initializing the ampacity to a first value, and
   performing the following loop steps at least one time:
      a1) estimating the probability of exceeding the distribution temperature for the given ampacity value,
      a2) comparing the estimated probability with the limit value, and
      a3) updating the ampacity value according to the comparison of step a2).

17. The method for monitoring a high-voltage electric-current transmission line as claimed in claim 15, wherein the joint probability model of the operating temperature and the operating current strength exceeding the distribution temperature is defined as the product, integrated over a plurality of current strengths between zero and the ampacity, of a probability, depending on the meteorological parameters, that the operating temperature is higher than the distribution temperature for a given current strength with a probability that the current strength is reached in light of the ampacity.

18. The method for monitoring a high-voltage electric-current transmission line as claimed in claim 15, wherein, in a transient thermal imbalance regime between heating and cooling powers of an overhead conductor of the high-voltage line, the probability of exceeding the distribution temperature is more precisely defined on the basis of the joint probability model of the operating current strength and the operating temperature exceeding the distribution temperature corrected at least by the following two multiplicative factors:
   a factor quantifying a probability of a defect appearing in the high-voltage line, and
   a factor quantifying a probability of the duration of maximum overload of the high-voltage line.

19. a non-transitory computer program recorded on a computer readable medium, that when executed by a processor of a computer, causes the computer to execute the steps of claim 15.

20. A device for monitoring a high-voltage electric-current transmission line, comprising:
   a computer, incorporating a processor and a memory, the memory having recorded thereon program code that, upon execution by the processor, causes the computer to determine an ampacity of the high-voltage line from a distribution temperature indicative of an operating temperature limit of the high-voltage line, conduction parameters of the high-voltage line and meteorological parameters;
   a storage unit that stores a determined ampacity value;
   a data transmission interface that receives, from at least one sensor (16) arranged on the high-voltage line, measurement data of a current strength effectively transmitted by the high-voltage line generated by said at least one sensor (16); and
   a detector that determines an exceeding of the ampacity (A) by the current strength based on the received measurement data from the at least one sensor,
   the storage unit also storing parameters of a joint probability model of i) operating current strength of the high-voltage line and ii) operating temperature of the high-voltage line exceeding the distribution temperature, where the joint probability model depends on meteorological parameters, wherein the joint probability model is $P_\theta(T>Trep,I)$, where
   $P_\theta$ is the joint probability depending on the meteorological parameters $\theta$,
   T is the operating temperature of the high-voltage line,
   Trep is the distribution temperature, and I is the operating current strength of the high-voltage line,
   wherein the program code further causes the computer to:
      determine the ampacity of the high-voltage line by selecting a value of the ampacity by optimizing a probability of exceeding the distribution temperature, with the probability defined based on the stored probability model $P_\theta(T>Trep,I)$, said optimizing including steps of iteratively approaching a predetermined limit value of said probability by iteratively varying the ampacity and recording of the selected ampacity value in a storage unit of a monitoring device, and
   in the event that the measured current strength is determined to exceed the selected ampacity for a predetermined duration, causing actuation of either of a visual or an audible alarm.

\* \* \* \* \*